United States Patent
Mitrovic et al.

(10) Patent No.: US 8,888,919 B2
(45) Date of Patent: Nov. 18, 2014

(54) WAFER CARRIER WITH SLOPED EDGE

(75) Inventors: Bojan Mitrovic, Somerset, NJ (US); Joshua Mangum, Basking Ridge, NJ (US); William E. Quinn, Whitehouse Station, NJ (US)

(73) Assignee: Veeco Instruments Inc., Plainview, NY (US)

( * ) Notice: Subject to any disclaimer, the term of this patent is extended or adjusted under 35 U.S.C. 154(b) by 726 days.

(21) Appl. No.: 13/037,770

(22) Filed: Mar. 1, 2011

(65) Prior Publication Data

US 2011/0215071 A1 Sep. 8, 2011

Related U.S. Application Data

(60) Provisional application No. 61/309,995, filed on Mar. 3, 2010.

(51) Int. Cl.
| | |
|---|---|
| *C23C 16/455* | (2006.01) |
| *C23C 16/458* | (2006.01) |
| *H01L 21/673* | (2006.01) |
| *H01L 21/687* | (2006.01) |
| *H01L 21/20* | (2006.01) |
| *C23C 16/30* | (2006.01) |

(52) U.S. Cl.
CPC ........ *H01L 21/68764* (2013.01); *C23C 16/303* (2013.01); *H01L 21/68771* (2013.01); *C23C 16/45587* (2013.01); *C23C 16/4585* (2013.01); *C23C 16/4584* (2013.01); *H01L 21/68735* (2013.01); *C23C 16/45563* (2013.01)
USPC . 118/730; 118/715; 156/345.34; 156/345.51; 156/345.55

(58) Field of Classification Search
None
See application file for complete search history.

(56) References Cited

U.S. PATENT DOCUMENTS

| | | | | |
|---|---|---|---|---|
| 3,633,537 | A | * 1/1972 | Howe | 118/725 |
| 3,783,822 | A | * 1/1974 | Wollam | 118/725 |
| 4,100,879 | A | * 7/1978 | Goldin et al. | 118/725 |
| 5,042,423 | A | 8/1991 | Wilkinson | |
| 5,173,336 | A | * 12/1992 | Kennedy | 427/248.1 |

(Continued)

FOREIGN PATENT DOCUMENTS

WO    WO 2007105877 A1 * 9/2007
WO    WO 2007148470 A1 * 12/2007

OTHER PUBLICATIONS

Virginia Semiconductor, "Your Guide to SEMI Specifications for Si Wafers," pp. 3 Jun. 2002, available Mar. 18, 2014 online at https://www.virginiasemi.com/?cont_uid=27.*

(Continued)

*Primary Examiner* — Jeffrie R Lund
*Assistant Examiner* — Stanislav Antolin
(74) *Attorney, Agent, or Firm* — Lerner, David, Littenberg, Krumholz & Mentlik, LLP

(57) ABSTRACT

A wafer carrier includes a body defining a central axis, a generally planar top surface perpendicular to the central axis, and pockets recessed below the top surface for receiving wafers. The body can include a lip projecting upwardly around the periphery of the top surface. The lip can define a lip surface sloping upwardly from the planar top surface in a radially outward direction away from the central axis. The body can be adapted for mounting on a spindle of a processing apparatus so that the central axis of the body is coaxial with the spindle. The lip can improve the pattern of gas flow over the top surface of the wafer carrier.

11 Claims, 7 Drawing Sheets

(56) References Cited

U.S. PATENT DOCUMENTS

| | | | |
|---|---|---|---|
| 5,195,729 A | | 3/1993 | Thomas et al. |
| 5,264,040 A | * | 11/1993 | Geyling ............... 118/728 |
| 5,273,588 A | * | 12/1993 | Foster et al. .......... 118/723 E |
| 5,556,476 A | * | 9/1996 | Lei et al. ............... 118/728 |
| 5,628,829 A | * | 5/1997 | Foster et al. .......... 118/723 E |
| 5,837,058 A | * | 11/1998 | Chen et al. ............ 118/728 |
| 5,968,379 A | * | 10/1999 | Zhao et al. ............ 219/121.52 |
| 6,113,700 A | * | 9/2000 | Choi ..................... 118/715 |
| 6,143,077 A | * | 11/2000 | Ikeda et al. ........... 118/715 |
| 6,143,082 A | * | 11/2000 | McInerney et al. ... 118/719 |
| 6,165,267 A | * | 12/2000 | Torczynski ............ 118/500 |
| 6,506,252 B2 | * | 1/2003 | Boguslavskiy et al. ....... 117/200 |
| 6,685,774 B2 | * | 2/2004 | Boguslavskiy et al. ....... 117/200 |
| 6,726,769 B2 | * | 4/2004 | Boguslavskiy et al. ....... 117/200 |
| 6,753,255 B1 | * | 6/2004 | Takada et al. ......... 438/680 |
| 6,841,049 B2 | * | 1/2005 | Ito et al. ................ 204/298.15 |
| 2002/0021981 A1 | | 2/2002 | Balmer |
| 2002/0106826 A1 | * | 8/2002 | Boguslavskiy et al. ....... 438/44 |
| 2003/0019582 A1 | * | 1/2003 | Drewery ................ 156/345.43 |
| 2003/0047132 A1 | * | 3/2003 | Boguslavskiy et al. ....... 117/200 |
| 2003/0111009 A1 | * | 6/2003 | Boguslavskiy et al. ....... 117/200 |
| 2003/0221624 A1 | * | 12/2003 | Jurgensen et al. ..... 118/725 |
| 2004/0175951 A1 | | 9/2004 | Chen |
| 2005/0266174 A1 | * | 12/2005 | Hou et al. .............. 427/569 |
| 2008/0041798 A1 | * | 2/2008 | Gilmore et al. ....... 211/41.18 |
| 2008/0057197 A1 | * | 3/2008 | Liu ........................ 427/248.1 |
| 2008/0069951 A1 | * | 3/2008 | Chacin et al. ......... 427/248.1 |
| 2008/0236497 A1 | * | 10/2008 | Vukovic et al. ....... 118/728 |
| 2009/0017190 A1 | * | 1/2009 | Sferlazzo et al. ...... 427/10 |
| 2009/0155028 A1 | * | 6/2009 | Boguslavskiy et al. .. 414/223.01 |
| 2010/0055318 A1 | * | 3/2010 | Volf et al. .............. 427/255.28 |
| 2010/0055915 A1 | * | 3/2010 | Kanegae et al. ....... 438/704 |
| 2010/0087050 A1 | * | 4/2010 | Armour et al. ........ 438/478 |
| 2012/0040514 A1 | * | 2/2012 | Gurary et al. .......... 438/478 |
| 2012/0171870 A1 | * | 7/2012 | Mitrovic et al. ....... 438/706 |
| 2013/0008610 A1 | * | 1/2013 | Jiang et al. ............. 156/345.55 |

OTHER PUBLICATIONS

International Search Report Application No. PCT/US2011/026618, dated Nov. 9, 2011.

* cited by examiner

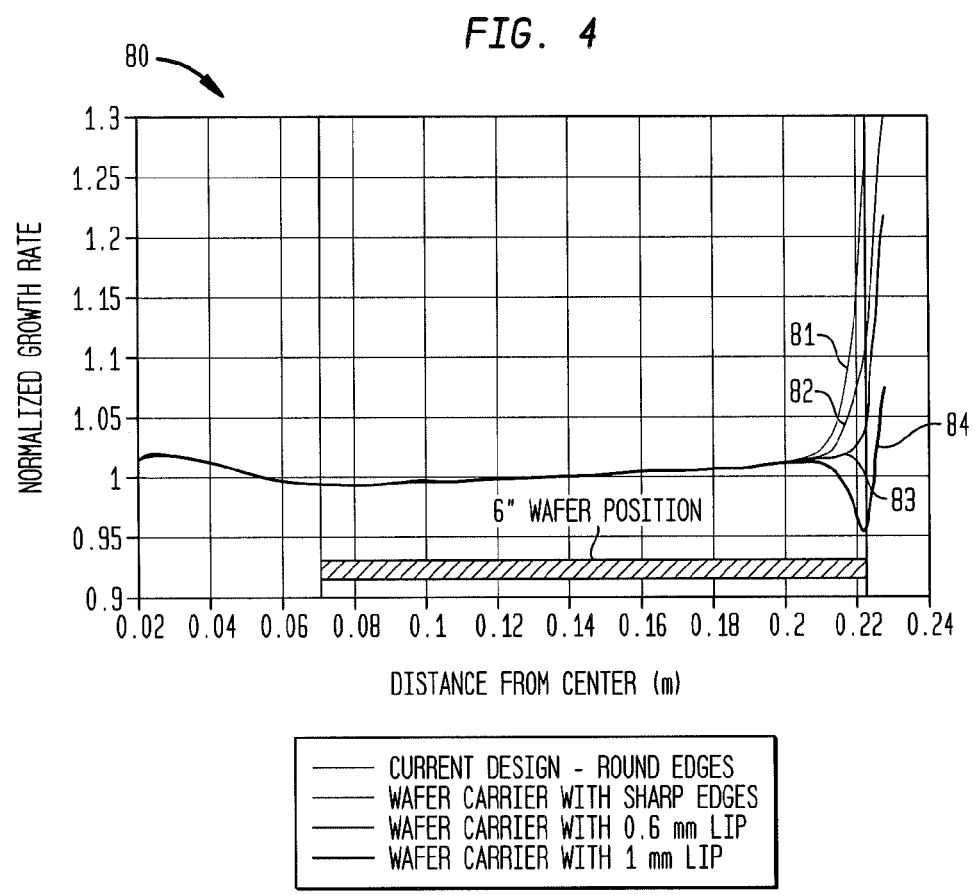

WAFER CARRIER WITH SLOPED EDGE

CROSS-REFERENCE TO RELATED APPLICATIONS

This application claims the benefit of the filing date of U.S. Provisional Patent Application No. 61/309,995, filed Mar. 3, 2010, the disclosure of which is hereby incorporated by reference herein.

BACKGROUND OF THE INVENTION

The present invention relates to methods and apparatus for treatment of substrates with a reactive gas, and to substrate carriers for use in such apparatus. For example, the present invention can be applied in chemical vapor deposition such as metalorganic chemical vapor deposition ("MOCVD") on substrates such as semiconductor wafers.

Many semiconductor devices are formed by processes performed on a substrate. The substrate typically is slab of a crystalline material, commonly referred to as a "wafer." Typically, a wafer is formed by growing a large crystal and slicing the crystal into the shape of a disc. One common process performed on such a wafer is epitaxial growth.

For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 500-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other electronic and optoelectronic devices can be fabricated in this way.

In a typical chemical vapor deposition process, numerous wafers are held on a component commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor devices.

For example, if a gallium indium nitride layer is deposited, variations in wafer surface temperature or concentrations of reactive gasses will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier. The used gas is evacuated from the reaction chamber through exhaust ports disposed below the wafer carrier and distributed around the axis of the spindle, typically near the periphery of the chamber.

The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

Although considerable effort has been devoted in the art heretofore to optimization of such systems, still further improvement would be desirable. In particular, it would be desirable to provide a more uniform diffusion boundary layer of the process gasses across the entire diameter of the wafer carrier during the MOCVD epitaxial growth process.

SUMMARY OF TEE INVENTION

Wafer carriers, a processing apparatus, and a method of method of processing wafers are provided. One aspect of the invention provides a wafer carrier. The wafer carrier includes a body defining a central axis, a generally planar top surface perpendicular to the central axis, and pockets recessed below the top surface for receiving wafers. The body can include a lip projecting upwardly around the periphery of the top surface. The lip can define a lip surface sloping upwardly from the planar top surface in a radially outward direction away from the central axis. The body can be adapted for mounting on a spindle of a processing apparatus so that the central axis of the body is coaxial with the spindle.

In a particular embodiment, the body can define a cylindrical peripheral surface coaxial with the central axis and the lip surface can join the peripheral surface at a sharp edge. In one example, the body can define a cylindrical peripheral surface coaxial with the central axis and the lip surface can join the peripheral surface at a radiused edge. In an exemplary embodiment, the lip surface can define a constant slope angle relative to the top surface of the wafer carrier. In a particular example, the lip surface can define a slope angle relative to the top surface of the wafer carrier, the slope angle varying as a function of radial distance to the central axis.

In one example, the lip surface can intersect the top surface at a radial distance from the central axis equal to a maximum radial extent of the pockets from the central axis. In a particular example, the lip surface can intersect the top surface at a radial distance from the central axis less than a maximum radial extent of the pockets from the central axis. In an exemplary embodiment, the height of the lip can be about 1 mm or less. In a particular example, the height of the lip can be about 0.6 mm. In a particular embodiment, the body can define a cylindrical peripheral surface coaxial with the central axis, the peripheral surface including a re-entrant surface projecting radially inwardly toward the central axis in a downward direction from a juncture between the lip surface and the peripheral surface.

Another aspect of the invention provides a wafer carrier. The wafer carrier includes a body defining a central axis, a generally planar top surface perpendicular to the central axis, and pockets recessed below the top surface for receiving wafers. The body can have a cylindrical peripheral surface coaxial with the central axis. The cylindrical peripheral surface can intersect the top surface at a sharp edge. The body can be adapted for mounting on a spindle of a processing apparatus so that the central axis of the body is coaxial with the spindle. In an exemplary embodiment, the peripheral surface can include a re-entrant surface projecting radially inwardly toward the central axis in a downward direction from a juncture between the top surface and the peripheral surface.

Yet another aspect of the invention provides a processing apparatus. The processing apparatus includes a reaction chamber, a spindle extending upwardly and downwardly within the chamber, a wafer carrier mounted to the spindle, a fluid inlet element communicating with the reaction chamber above the wafer carrier, and an exhaust system communicating with the reaction chamber below the wafer carrier. The wafer carrier can be any of the wafer carriers described above. The central axis of the spindle can be coaxial with the spindle. The fluid inlet element can be constructed and arranged to direct one or more gasses downwardly toward the wafer carrier.

Still another aspect of the invention provides a method of processing wafers. The method includes the steps of directing gases downwardly onto the wafer carrier of the processing apparatus as described above while wafers are disposed in the pockets of the wafer carrier, and while rotating the spindle and wafer carrier about the central axis and while removing gasses through the exhaust system.

In a particular embodiment, the method can include the step of heating the wafer carrier and wafers. In an exemplary embodiment, the gasses can react to form a deposit on exposed surfaces of the wafers. In one example, the flow at elevations above the top surface of the wafer carrier and near the periphery of the wafer carrier can be substantially non-recirculating.

BRIEF DESCRIPTION OF THE DRAWINGS

FIG. 3c is a top plan view of the wafer carrier shown in FIG. 3a.

FIG. 4 is a graph showing the normalized epitaxial growth rate as a function of distance from the central axis of the wafer carrier for particular design choices of the wafer carrier embodiments shown in FIGS. 2, 3a, and 5.

DETAILED DESCRIPTION

As described, for example, in PCT International Application No. PCT/US2009/063532 ("the '532 Application", now published as International Patent Publication No. WO 2010/054184), as well as in U.S. Pat. No. 6,197,121, entitled "CHEMICAL VAPOR DEPOSITION APPARATUS", issued Mar. 6, 2001, assigned to the assignee of the present application, the disclosures of which are hereby incorporated by reference herein, one type of apparatus which can be used to treat flat substrates such as semiconductor wafers with gases is a chemical vapor deposition apparatus 10, which is sometimes referred to as a "vertical rotating disc reactor."

Figure 1:
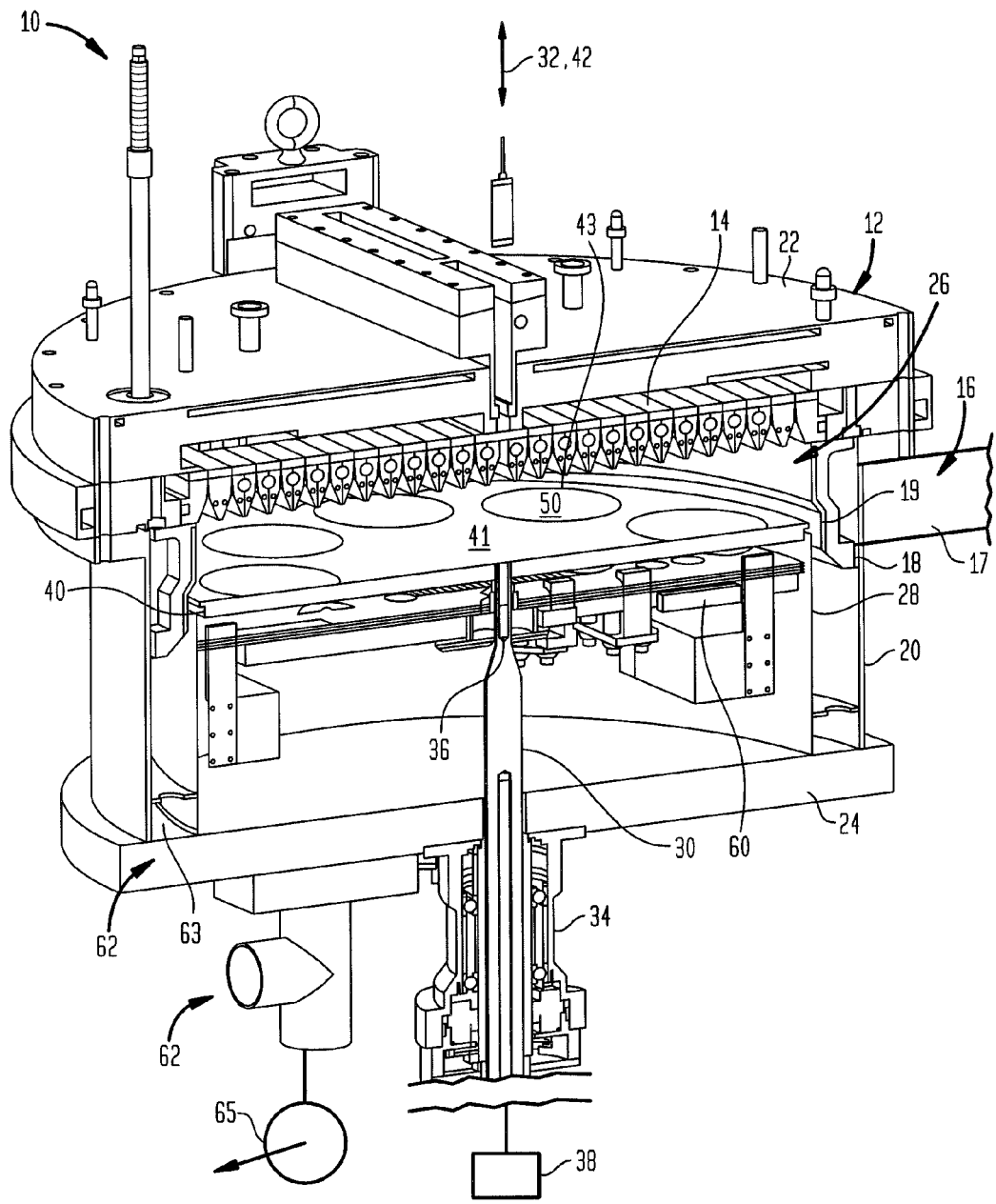
FIG. 1 is a perspective sectional view depicting chemical vapor deposition apparatus in accordance with one embodiment of the invention.

Referring to FIG. 1, the chemical vapor deposition apparatus 10 in accordance with one embodiment of the invention includes a reaction chamber 12 having a gas inlet manifold 14 arranged at one end of the chamber 12. The end of the chamber 12 having the gas inlet manifold 14 is referred to herein as the "top" end of the chamber 12. This end of the chamber typically, but not necessarily, is disposed at the top of the chamber in the normal gravitational frame of reference. Thus, the downward direction as used herein refers to the direction away from the gas inlet manifold 14; whereas the upward direction refers to the direction within the chamber, toward the gas inlet manifold 14, regardless of whether these directions are aligned with the gravitational upward and downward directions. Similarly, the "top" and "bottom" surfaces of elements are described herein with reference to the frame of reference of chamber 12 and manifold 14.

The chamber 12 has a cylindrical wall 20 that extends between a top flange 22 at the top end of the chamber and a base plate 24 at the bottom end of the chamber. The wall 20, the flange 22, and the base plate 24 define an air-tight sealed interior region 26 therebetween that can contain gasses emitted from the gas inlet manifold 14. Although the chamber 12 is shown as cylindrical, other embodiments can include a chamber having another shape, including, for example, a cone or other surface of revolution about a central axis 32, a square, a hexagon, an octagon, or any other appropriate shape.

The gas inlet manifold 14 is connected to sources for supplying process gases to be used in the wafer treatment process, such as a carrier gas and reactant gases such as a metalorganic compound and a source of a group V metal. In a typical chemical vapor deposition process, the carrier gas can be nitrogen, hydrogen, or a mixture of nitrogen and hydrogen, and hence the process gas at the top surface of a wafer carrier can be predominantly composed of nitrogen and/or hydrogen with some amount of the reactive gas components. The gas inlet manifold 14 is arranged to receive the various gases and direct a flow of process gasses generally in the downward direction.

The gas inlet manifold 14 can also be connected to a coolant system (not shown) arranged to circulate a liquid through the gas distribution element so as to maintain the temperature of the element at a desired temperature during operation. A similar coolant arrangement (not shown) can be provided for cooling the walls of the chamber 12.

The chamber 12 can also be provided with an entry opening 16 leading to an antechamber 17, and a moveable shutter 18 for closing and opening the entry opening 16. The shutter 18 can be configured as disclosed, for example, in U.S. Pat. No. 7,276,124, the disclosure of which is hereby incorporated by reference herein. The shutter 18 desirably is in the form of a circular hoop extending around the circumference of the chamber 12. The shutter 18 may have an interior surface 19 that defines the interior surface of the chamber 12.

A spindle 30 is arranged within the chamber for rotation about a vertical central axis 32. The central axis of the spindle 30 extends in the upward and downward directions of the reaction chamber 12. The spindle is mounted to the chamber 12 by a conventional rotary pass-through device 34 incorporating bearings and seals (not shown) so that the spindle can rotate about the central axis 32, while maintaining a seal between the spindle 30 and the base plate 24 of the chamber 12. The spindle 30 has a fitting 36 at its top end, i.e., at the end of the spindle closest to the gas inlet manifold 14.

The spindle 30 is connected to a rotary drive mechanism 38 such as an electric motor drive, which is arranged to rotate the spindle about the central axis 32. The spindle 30 can also be provided with internal coolant passages extending generally in the axial directions of the spindle within the gas passageway. The internal coolant passages can be connected to a coolant source, so that a fluid coolant can be circulated by the source through the coolant passages and back to the coolant source.

A wafer carrier 40 can be substantially in the form of a disc having a flat, circular top surface 41 and a central axis 42. In the operative position shown in FIG. 1, the wafer carrier 40 is mounted on the spindle 30, such that the central axis 42 of the wafer carrier is coincident with the axis 32 of the spindle. The wafer carrier 40 is located below the gas inlet manifold 14 within the chamber 12, such that the gas inlet manifold can discharge gas downwardly toward the wafer carrier while the wafer carrier rotates. When the shutter 18 is in the operating position shown in FIG. 1, the interior surface 19 of the shutter surrounds the wafer carrier 40.

The wafer carrier 40 can be formed as a single piece or as a composite of plural pieces. For example, as disclosed in U.S. Published Patent Application No. 20090155028, the disclosure of which is hereby incorporated by reference herein, the wafer carrier 40 may include a hub defining a small region of the wafer carrier surrounding the central axis and a larger portion defining the remainder of the disc-like body.

The wafer carrier 40 can be formed from materials that do not contaminate the CVD process and that can withstand the temperatures encountered in the process. For example, the larger portion of the wafer carrier 40 may be formed largely or entirely from materials such as graphite, silicon carbide, boron nitride, aluminum nitride, or other refractory materials.

The wafer carrier 40 has generally planar upper and lower surfaces extending generally parallel to one another and generally perpendicular to the vertical rotational axis 42 of the wafer carrier. In one example, the wafer carrier 40 can be about 300 mm to about 700 mm in diameter.

The top surface 41 of the wafer carrier 40 can include pockets 43 arranged circumferentially about the wafer carrier, each such pocket being configured to removably receive a disc-like wafer 50 and to hold such wafer during a MOCVD process such as that described below. Each wafer 50 can be formed from a sapphire, silicon carbide, silicon, or other crystalline substrate. Typically, each wafer 50 has a thickness which is small in comparison to the dimensions of its major surfaces. For example, a circular wafer 50 about 2 inches (50 mm) in diameter may be about 430 µm thick or less. Each wafer 50 can disposed on or adjacent the wafer carrier 40 with a top surface thereof facing upwardly, so that the top surface of the wafer is exposed at the top surface of the wafer carrier. The wafers 50 can be coplanar or nearly coplanar with the top surface 41 of the wafer carrier 40.

For many processes such as MOCVD, the wafer carrier is heated to provide the desired temperature at the surfaces of the wafers 50. For such heating, a heating element 60 is mounted within the chamber 12 and surrounds the spindle 30 below the fitting 36. The heating element 60 can transfer heat to the bottom surface of the wafer carrier 40, principally by radiant heat transfer. Heat applied to the bottom surface of the wafer carrier 40 can flow upwardly through the body of the wafer carrier to the top surface 41 thereof. Heat can pass upwardly to the bottom surface of each wafer held by the wafer carrier 40, and upwardly through the wafers 50 and to the top surfaces thereof. Heat can be radiated from the top surfaces of the wafers 50 to the colder elements of the process chamber 12 as, for example, to the walls 20 of the process chamber and to the gas inlet manifold 14. Heat can also be transferred from the top surfaces of the wafers 50 to the process gas passing over these surfaces. In a particular embodiment, the heating element 60 can be a multi-zone heating element, whereby different portions of the wafer carrier 40 (e.g., a first annular portion located at a first radial distance from the central axis 32 of the spindle 30, and a second annular portion located at a second radial distance from the central axis) can be heated differently.

The chamber 12 also includes an outer liner 28 that reduces process gas penetration into the area of the chamber containing the heating element 60. In an example embodiment, heat shields (not shown) can be provided below the heating element 60, for example, disposed parallel to the wafer carrier 40, to help direct heat from the heating element upwards towards the wafer carrier and not downwards towards the base plate 24 at the bottom end of the chamber 12.

The chamber 12 is also equipped with an exhaust system 62 arranged to remove spent gases from the interior region 26 of the chamber. The exhaust system 62 is connected to the chamber 12 at a location below the location occupied by the wafer carrier 40. The exhaust system 62 can include an exhaust manifold 63 at or near the bottom of the chamber 12. The exhaust manifold 63 can be connected to a pump 65 or other vacuum source that can be configured to carry spent gasses out of the reaction chamber 12.

In operation, the entry opening 16 is opened by lowering the shutter 18 to an open position. Then, the wafer carrier 40 with wafers 50 loaded thereon is loaded from the antechamber 17 into the chamber 12 and is placed in the operative position shown in FIG. 1. In this condition, the top surfaces of the wafers 50 face upwardly, towards the gas inlet manifold 14. The entry opening 16 is closed by raising the shutter 18 to the closed position depicted in FIG. 1. The heating element 60 is actuated, and the rotary drive 38 operates to turn the spindle 30 and hence the wafer carrier 40 around the central axis 42. Typically, the spindle 40 is rotated at a rotational speed from about 50-1500 revolutions per minute.

Process gas supply units (not shown) are actuated to supply gases through the gas inlet manifold 14. The gases pass downwardly toward the wafer carrier 40, over the top surface 41 of the wafer carrier and the top surfaces of the wafers 50, and downwardly around a periphery of the wafer carrier to the exhaust manifold 63 of the exhaust system 62. Thus, the top surface 41 of the wafer carrier 40 and the top surfaces of the wafers 50 are exposed to a process gas including a mixture of the various gases supplied by the various process gas supply units. Most typically, the process gas at the top surface 41 is predominantly composed of the carrier gas supplied by a carrier gas supply unit (not shown).

The process continues until the desired treatment of the wafers 50 has been completed. Once the process has been completed, the entry opening 16 is opened by lowering the shutter 18. Once the entry opening 16 is open, the wafer carrier 40 can be removed from the spindle 30 and can be replaced with a new wafer carrier 40 for the next operational cycle.

Figure 2A:
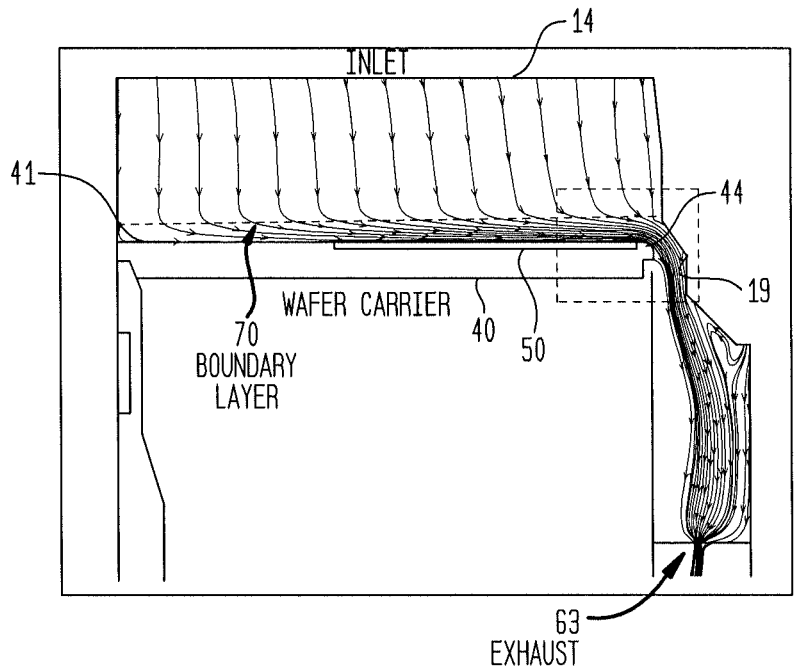
FIGS. 2a and 2b are a fragmentary cross-sectional view and an enlarged fragmentary cross-sectional view of a prior art wafer carrier and a pattern of gas flow. Presentation of these figures does not constitute an admission that the pattern of gas flow was known in the prior art.
Figure 2B:
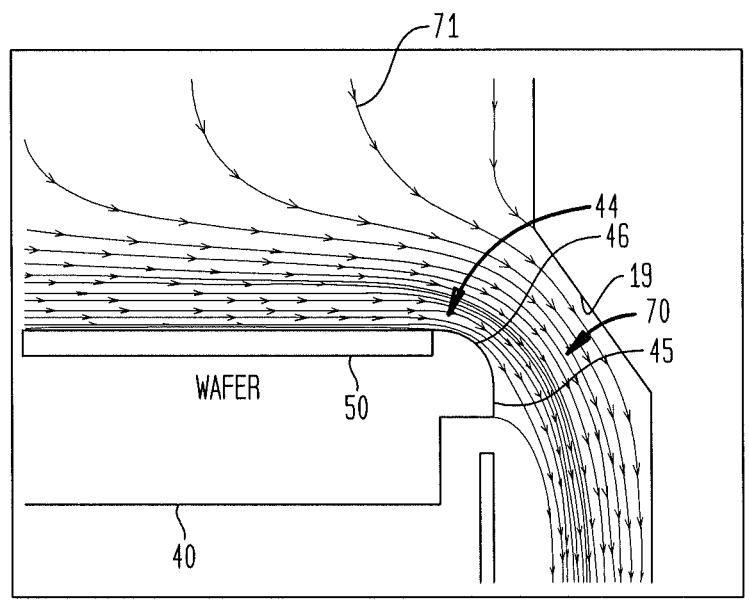

Referring now to FIGS. 2a and 2b, the gasses discharged from the flow inlet element 14 flow downwardly in the region remote from the top surface 41 of the wafer carrier 40, and outwardly toward a peripheral region 44 of the top surface of the carrier in a boundary layer 70 immediately overlying the top surface and the exposed surfaces of the wafers 50 to be treated. As the gases pass beyond the peripheral edge 46 of the top surface 41 of the carrier they flow downwardly between the peripheral surface 45 of the carrier and the surrounding surface 19 defined by the shutter 18.

In vertical rotating disc reactors such as the chemical vapor deposition apparatus 10, the rate of certain treatment processes, such as the growth rate in an MOCVD process under mass-transport-limited growth conditions, is inversely related to the boundary layer thickness. For the case of an infinitely large carrier, theory predicts that the rate is inversely proportional to the boundary layer thickness (growth rate=1/(boundary layer thickness)). This means that for thinner boundary layers the growth rate is higher since it takes less time for sources to diffuse to the carrier surface. Hence, a thin and uniform diffusion boundary layer is very important in obtaining uniform and fast deposition rate during the MOCVD epitaxial growth. Boundary layer thickness can be controlled by changing the rotation rate and pressure in reactor and is inversely proportional of the square root of those two parameters. It can also be controlled by changing gas mixture properties such as dynamic viscosity, which is a function of the fractions of different gases in the mixture as well as of the carrier and inlet temperatures.

Typically, for stable flow conditions in the reactor 12, with no disturbances due to rotation or buoyancy-induced recirculation or due to high differences in gas velocities or densities at the gas inlet element, and with uniform heating of the wafer carrier 40, uniform boundary layer thickness can be achieved above the majority of the top surface 41 of the wafer carrier. However, due to the finite radius of the wafer carrier 40 and the typical position of the exhaust manifold 63 (FIG. 1) below the carrier, gas streamlines 71 are changing direction from radial above the wafer carrier to axial towards the exhaust manifold, which results in "rolling off" or "bending" of the boundary layer at the peripheral edge 46 of the top surface 41 of the carrier, as schematically depicted in FIG. 2b.

Stated another way, as the gas transitions from radially outward flow over the top surface 41 of the carrier 40 to downward flow between the peripheral surface 45 of the carrier and the surrounding surface 19 of the chamber 12, the streamlines 71 tend to converge over the peripheral region 44 of the carrier top surface. The boundary layer 70 becomes thinner over the peripheral region 44 of the top surface 41 near the peripheral edge 46. The thinner boundary layer 70 results in higher epitaxial growth rates near the peripheral edge 46 of the top surface 41 of the carrier 40. Typically, wafer carriers used prior to the present invention had a substantial radius at the peripheral edge 46 of the top surface 41, on the order of 5 mm, as also shown in FIG. 2b. One aspect of the present invention incorporates the realization that the radiused peripheral edge 46 contributes to boundary layer thinning.

The boundary layer thickness can be less than 1 cm. Thus, very small changes in the boundary layer thickness (~1 mm) at the peripheral edge 46 of the top surface 41 of the carrier 40 can result in significant growth rate increase. To avoid exposure of the wafers 50 to non-uniform growth rates, it has been the practice to avoid locating wafers 50 close to the peripheral edge 46 of the top surface 41 of the carrier 40. However, this reduces reactor efficiency and potential yield since a significant portion of the top surface 41 near the edge of the carrier is not occupied by wafers.

Figure 3A:
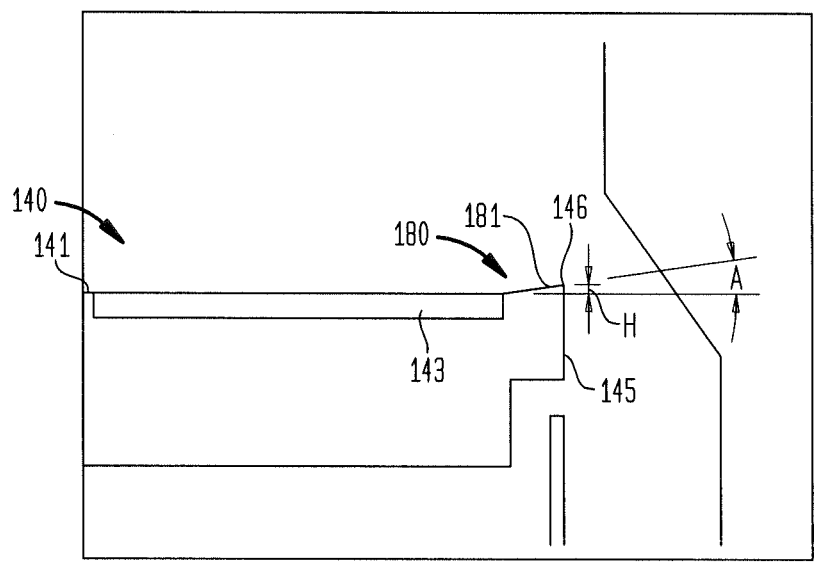
FIG. 3a is an enlarged fragmentary cross-sectional view of a wafer carrier according to one embodiment of the invention, suitable for use in the chemical vapor deposition apparatus illustrated in FIG. 1.

One aspect of this invention proposes reshaping of the wafer carrier by introducing a lip at the carrier edge to compensate for the boundary layer thinning. As seen in FIGS. 3a and 3c, a wafer carrier 140 includes a body defining a central axis 142 and a generally planar top surface 141 substantially perpendicular to the central axis. The body has pockets 143 open to the top surface 141 and recessed below the plane of the top surface. The pockets 143 are arranged to hold substrates such as wafers 50 so that top surfaces 51 of the substrates are exposed and lie coplanar or nearly coplanar with the top surface 141 of the carrier 140. The wafer carrier 140 is adapted for mounting on the spindle 30 of a processing apparatus such as the apparatus 10 (FIG. 1) so that the central axis 142 of the carrier is coaxial with the central axis 32 of the spindle. For example, the wafer carrier 140 may have a fitting adapted to engage a corresponding fitting on the spindle such as the fitting 36 (FIG. 1). In one such arrangement, the wafer carrier has a female conical fitting (such as the fitting 236 shown in FIG. 5) coaxial with the central axis and open at the bottom of the body, whereas the spindle has a male conical fitting (such as the fitting 36 shown in FIG. 1). The wafer carrier 140 may be generally in the form of a flat disc, with a bottom surface generally parallel to the top surface 141.

A lip 180 extends upwardly from the planar top surface 141 of the carrier 140. The optimum lip height H will depend upon process conditions, but by way of example the lip height H may be between 0 and 1 mm, typically about 0.3 to 0.8 mm as, for example, about 0.6 mm for operation in process conditions that create a boundary layer thickness of about 0.7 to 1.0 cm. The lip 180 has an upwardly-facing lip surface 181 sloping upwardly from the planar top surface 141 and joining the cylindrical peripheral surface 145 of the carrier at a sharp edge 146. The slope angle A, i.e., the angle between the sloping surface 181 of the lip 180 and the planar top surface 141 of the wafer carrier 140 also may be varied. By way of example, the slope angle A may be between 10 and 15 degrees. As shown in FIGS. 3a and 3c, the sloping surface 181 of the lip 180 desirably joins the top surface 141 at a radial distance from the central axis of the wafer carrier just outside of the region occupied by the pockets 143. That is, the sloping surface 181 of the lip intersects the planar top surface 141 of the carrier 140 just at, or slightly outside of, the maximum radial extent $R_{MAX}$ of the pockets 143. As best appreciated with reference to FIG. 3c, the lip 180 extends around the entire periphery 144 of the wafer carrier 140, and thus defines a portion of a cone.

In the embodiment of FIGS. 3a and 3c, the lip surface 181 is conical, and thus the slope angle A is constant over the radial extent of the lip surface 181. However, the slope angle need not be constant. For example, the slope angle may increase or decrease progressively in the radially-outward direction, away from the central axis 142.

Figure 3B:
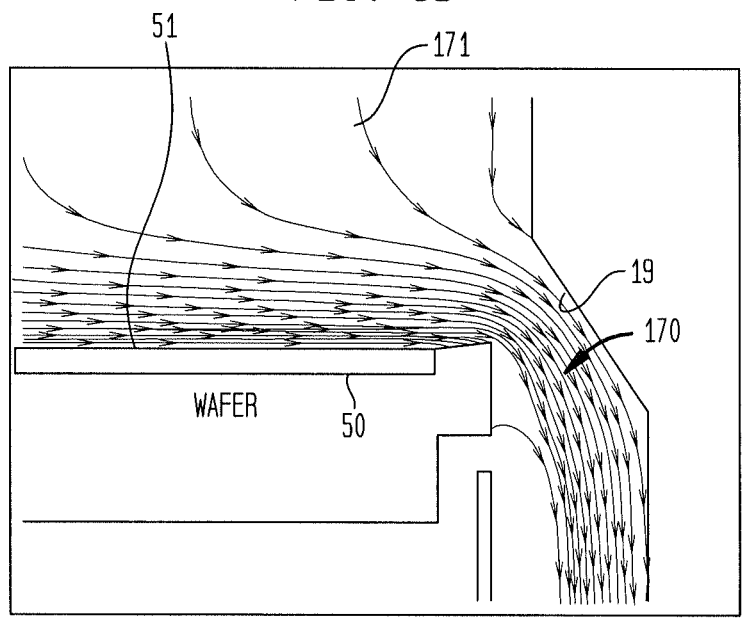
FIG. 3b is an enlarged fragmentary cross-sectional view of the wafer carrier shown in FIG. 3a, also showing a boundary layer of process gasses traveling over the wafer carrier.
Figure 3C:
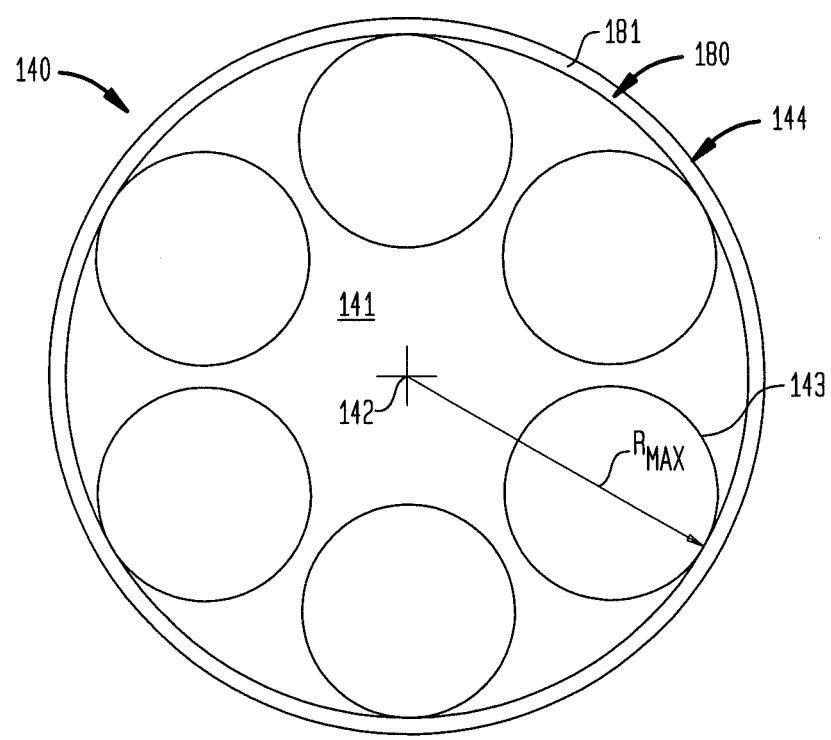

As shown in FIG. 3b, the thickness of the boundary layer 170 traveling over the wafer carrier 140 is more uniform across the top surface 51 of the wafer 50 than the thickness of the boundary layer 70 traveling over the wafer carrier 40 shown in FIG. 2.

Figure 5:
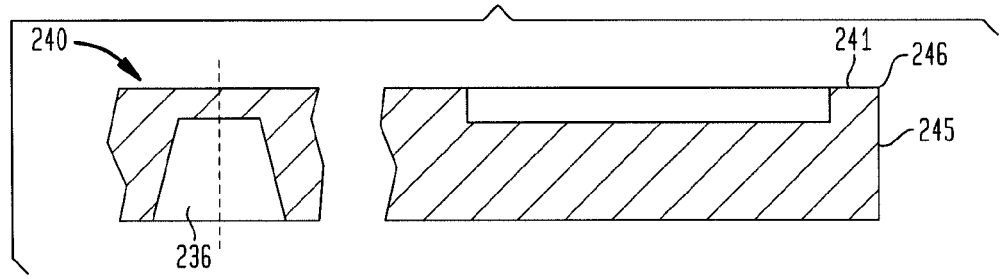
FIGS. 5-8 are enlarged fragmentary cross-sectional views of wafer carriers according to further embodiments of the invention, suitable for use in the chemical vapor deposition apparatus illustrated in FIG. 1.

A further aspect of the invention uses a wafer carrier 240 having a sharp peripheral edge 246, without a lip, as shown in FIG. 5. Such a sharp edge 246 can enhance deposition uniformity as compared to an edge with a substantial radius such as that shown in FIG. 2. A "sharp" edge as referred to herein has a radius of 0.1 mm or less, and desirably is as close as practicable to a zero radius, perfectly sharp intersection between the top surface 241 of the carrier 240 and the peripheral surface 245.

Referring now to FIG. 4, it has been found using computational fluid dynamic modeling that a small lip 181 can significantly improve deposition uniformity at the periphery of the wafer carrier and hence, in utilizing much more of the carrier surface. Under the particular operating conditions modeled in FIG. 4, a graph 80 shows that the conventional wafer carrier with a radiused edge ("current design-rounded edges") shown as line 81 produces a large increase in the normalized deposition rate in the region near the periphery of the wafer carrier (at a distance from the central axis of about 0.21 to 0.22 m) relative to the deposition rate in regions closer to the center. Such non-uniform deposition rate effectively precludes placement of pockets and wafers in this peripheral region.

The modeled performance of the carrier with a sharp edge (e.g., FIG. 5), shown as line 82, and carriers with lips (e.g., FIG. 3a), shown as lines 83 and 84, tend to show a reduced deposition rate in the region near the periphery of the carrier. The lip provides a greater effect in reducing the epitaxial deposition rate at the periphery of the wafer carrier than the sharp edge. The larger the lip, the greater the reduction in deposition rate. The reduction provided by the carrier with a 0.6 mm lip height (line 83) is enough to make the deposition rate in the peripheral region nearly uniform and nearly equal to the deposition rate in interior regions of the carrier. The reduction provided by the carrier with 1.0 mm lip height (line 84) is so great that that the deposition rate in the peripheral region is significantly less than the deposition rate in the interior region, which indicates that the 1.0 mm lip height is greater than optimum for this set of process conditions. Thus, the choice of whether to use a sharp edge or a lip, and choice of a lip height, can be guided by the results achieved in modeling or operation of the conventional apparatus.

As disclosed, for example, in the '532 application, under some operating conditions a vortex forms at an elevation above the wafer carrier top surface and just outside the periphery of the top surface. When such a vortex extends near the periphery of the wafer carrier, the normalized deposition rate decreases, rather than increases, in the peripheral region of the wafer carrier. The lip or sharp edge typically is not used under those operating conditions. Stated another way, the sharp edge and the lip are most advantageously applied under operating conditions that the gas flow at elevations above the top surface of the wafer carrier and near the periphery of the wafer carrier is substantially non-recirculating (e.g., as shown in FIGS. 2a and 3b).

Figure 6:
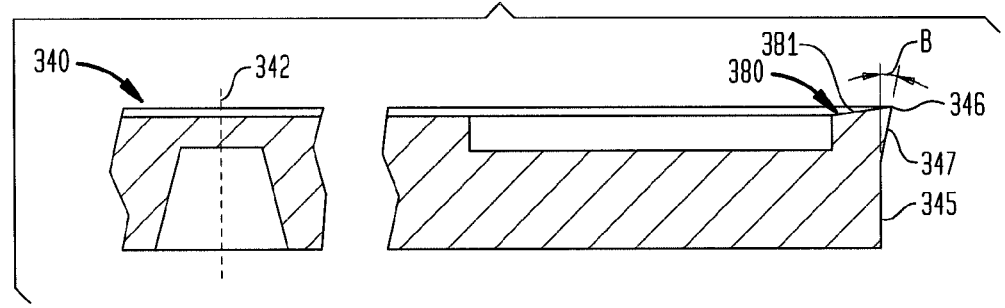

As shown in FIG. 6, the peripheral surface of the wafer carrier 340 may include a re-entrant surface 347. The re-entrant surface 347 slopes inwardly, toward the central axis 342, in the downward direction from its juncture 346 with the upwardly sloping surface 381 of the lip 380. The re-entrant surface 347 influences the fluid flow near the juncture 346. In further variants, the re-entrant surface may constitute the entire peripheral surface 345, and may have a more severe inward angle B than depicted, or a less severe inward angle. The re-entrant surface may be curved, so that the slope angle B of the re-entrant surface varies.

Figure 7:
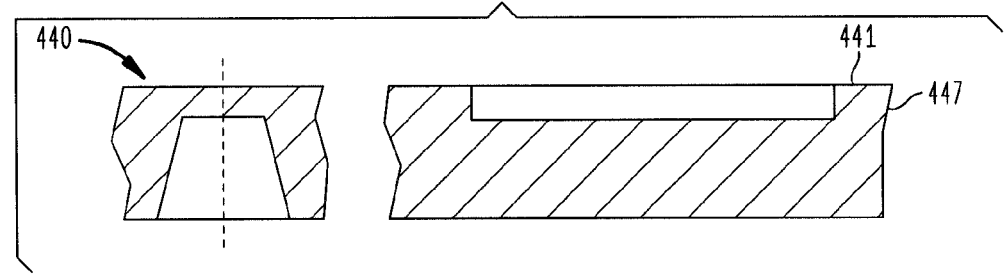
Figure 8:
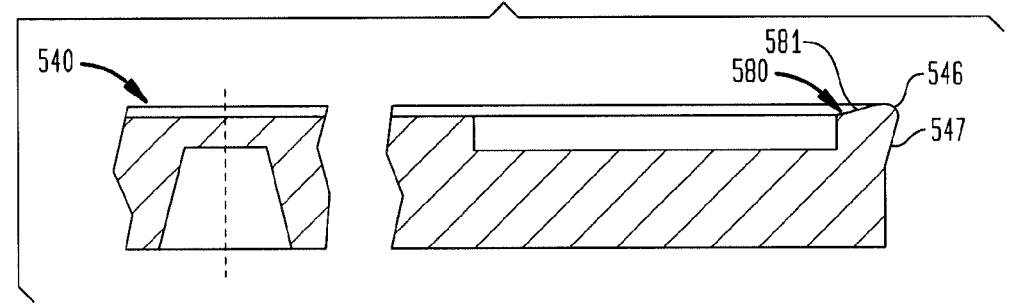

In yet another variant, as shown in FIG. 7, a re-entrant peripheral surface 447 can be used without an upwardly-sloping lip, so that the re-entrant peripheral surface joins the planar top surface 441 of the carrier 440. In a still further variant, as shown in FIG. 8, the juncture 546 of the re-entrant surface 547 and the sloping surface 581 of the lip 580 or the planar top surface 541 of the carrier 540 may have a radius.

Figure 9A:
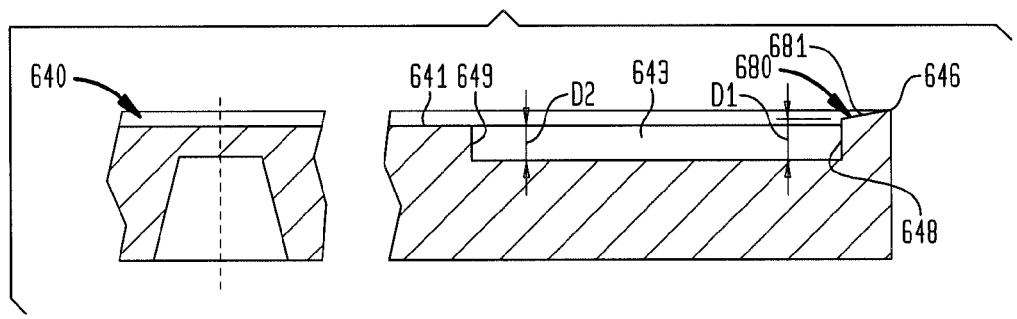
FIGS. 9a and 9b are an enlarged fragmentary cross-sectional view and a top plan view of a wafer carrier according to yet another embodiment of the invention, suitable for use in the chemical vapor deposition apparatus illustrated in FIG. 1.
Figure 9B:
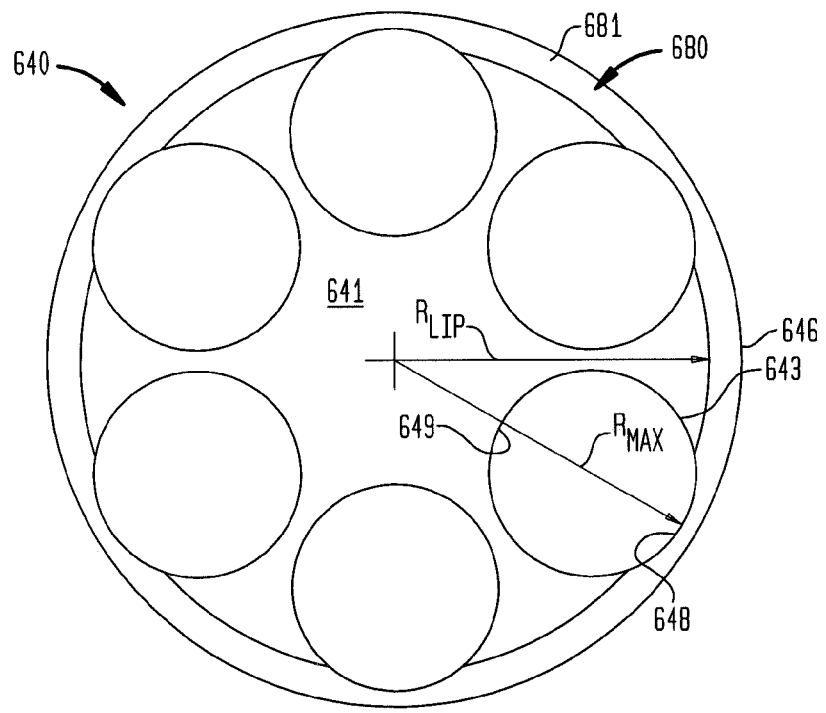

In another variant, as shown in FIGS. 9a and 9b, a wafer carrier 640 can include a lip 680 that slopes downwardly and radially inwardly from the peripheral edge 646 of the top surface 641 of the wafer carrier, such that the lip can extend radially into the region where the pockets 643 are located. For example, the lip 680 can extend radially inwardly about 0.5 inches from the peripheral edge 646. In such an embodiment, the sloping surface 681 of the lip 680 can intersect the planar top surface 641 of the carrier 640 at a radius $R_{LIP}$, which is slightly inside of the maximum radial extent $R_{MAX}$ of the pockets 643. The depth D1 of an outer portion 648 of the pockets 643 can be slightly greater than the depth D2 of an inner portion 649 of the pockets. Such a wafer carrier 640 can have a vertical step relative to the height of the top surface 641 at the intersection of the inner portion 649 and the sloping surface 681, but this step can be small relative to a typical boundary layer height of about 1 cm, so such a step may not have a significant effect on the epitaxial growth at the radially outer portion of the wafers located in the pockets.

Although the foregoing discussion focuses on use of the wafer carrier in growth processes, the carrier can also be used in other processes. The invention can be applied in various wafer treatment processes as, for example, chemical vapor deposition, chemical etching of wafers, and the like.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

We claim:

1. A wafer carrier comprising a body defining a central axis, a generally planar top surface perpendicular to the central axis, and pockets recessed below the top surface for receiving wafers, the body including a lip projecting upwardly around the periphery of the top surface, the lip defining a lip surface sloping upwardly from the planar top surface in a radially outward direction away from the central axis, the body being adapted for mounting on a spindle of a processing apparatus so that the central axis of the body is coaxial with the spindle.

2. A wafer carrier as recited in claim 1 wherein the body defines a cylindrical peripheral surface coaxial with the central axis and the lip surface joins the peripheral surface at a sharp edge.

3. A wafer carrier as recited in claim 1 wherein the body defines a cylindrical peripheral surface coaxial with the central axis and the lip surface joins the peripheral surface at a radiused edge.

4. A wafer carrier as recited in claim 1 wherein the lip surface defines a constant slope angle relative to the top surface of the wafer carrier.

5. A wafer carrier as recited in claim 1 wherein the lip surface defines a slope angle relative to the top surface of the wafer carrier, the slope angle varying as a function of radial distance to the central axis.

6. A wafer carrier as recited in claim 1 wherein the lip surface intersects the top surface at a radial distance from the central axis equal to a maximum radial extent of the pockets from the central axis.

7. A wafer carrier as recited in claim 1 wherein the lip surface intersects the top surface at a radial distance from the central axis less than a maximum radial extent of the pockets from the central axis.

8. A wafer carrier as recited in claim 1 wherein the height of the lip is about 1 mm or less.

9. A wafer carrier as recited in claim 1 wherein the height of the lip is about 0.6 mm.

10. A wafer carrier as recited in claim 1 wherein the body defines a cylindrical peripheral surface coaxial with the central axis, the peripheral surface including a re-entrant surface projecting radially inwardly toward the central axis in a downward direction from a juncture between the lip surface and the peripheral surface.

11. A processing apparatus comprising:
(a) a reaction chamber;
(b) a spindle extending upwardly and downwardly within the chamber;
(c) a wafer carrier as recited in claim 1 mounted to the spindle, the central axis of the spindle being coaxial with the spindle;
(d) a fluid inlet element communicating with the reaction chamber above the wafer carrier, the fluid inlet element being constructed and arranged to direct one or more gasses downwardly toward the wafer carrier; and
(e) an exhaust system communicating with the reaction chamber below the wafer carrier.

* * * * *